United States Patent [19]

Nakagawara et al.

[11] Patent Number: 4,728,900
[45] Date of Patent: Mar. 1, 1988

[54] BALANCED DIFFERENTIAL AMPLIFIER

[75] Inventors: Akira Nakagawara; Kazuo Watanabe, both of Kanagawa, Japan

[73] Assignee: Sony Corporation, Tokyo, Japan

[21] Appl. No.: 847,539

[22] Filed: Apr. 3, 1986

[30] Foreign Application Priority Data

Apr. 8, 1985 [JP] Japan .................................. 60-74036

[51] Int. Cl.$^4$ ............................................. H03F 3/45
[52] U.S. Cl. .................................... 330/253; 330/258; 307/530
[58] Field of Search ....................... 330/253, 258, 257; 307/530; 365/207, 208, 230

[56] References Cited

U.S. PATENT DOCUMENTS

| 4,152,663 | 5/1979 | Van de Sande | 330/253 |
| 4,267,517 | 5/1981 | Iida et al. | 330/253 |
| 4,554,515 | 11/1985 | Burson et al. | 330/261 |
| 4,606,012 | 8/1986 | Koshizuka | 307/530 X |

FOREIGN PATENT DOCUMENTS 0168198  6/1985  European Pat. Off. .
2802189  3/1978  Fed. Rep. of Germany .

OTHER PUBLICATIONS

Iizuka et al, "Fully Static 16 Kb Bulk CMOS RAM", 1980 IEEE International Solid-State Circuits Conference, Feb. 15, 1980, pp. 226, 227, 277.

Primary Examiner—James B. Mullins
Attorney, Agent, or Firm—Ronald P. Kananen

[57] ABSTRACT

In a balanced differential amplifier, a constant current source MOS FET operable in an unsaturated region is usually incorporated. When noise is inputted to the differential amplifier, the current source FET undergoes an influence of noise level superposed upon the input signal DC voltage thereof, thus deteriorating the constant current characteristics. To overcome this problem, a pair of current source MOS FETs are additionally incorporated therewith. Since the two current source MOS FETs operate near a boundary between saturated and unsaturated regions and further the gate voltages applied thereto varies in out-of-phase relationship to each other in response to input signal fluctuations, it is possible to keep constant the sum total of two currents flowing through the two constant current MOS FETs, thus improving the overall constant current characteristics and therefore the suppression capability against noise inputted in phase to the amplifier.

14 Claims, 3 Drawing Figures

BALANCED DIFFERENTIAL AMPLIFIER

BACKGROUND OF THE INVENTION

1. Field of the Invention

The present invention relates generally to a balanced differential amplifier applied to a read amplifier for amplifying a read signal supplied from a storage device incorporated with a computer, and more specifically to an improvement of the overall constant current characteristics of the balanced differential amplifier.

2. Description of the Prior Art

Conventionally, a read amplifier, i.e. a sensing amplifier, is used to amplify a minute read signal supplied from an inner storage device or an outer storage device, i.e. a memory unit, of an electronic computer to a voltage level sufficiently high to activate logic circuits. In the read amplifier, since suppression of two in-phase input signals is required in addition to linear amplification, the circuit is basically configured to depend upon differential amplifiers.

The balanced output signal obtained from the output terminals of a differential amplifier is usually supplied to a succeeding-stage amplifier. In a read amplifier for a high-speed multi-output memory unit, however, since the succeeding-stage amplifier usually has a large driving capability, when a large capacitive load is connected to the output terminals of the succeeding-stage differential amplifier, a large-amplitude transient current flows through the succeeding-stage amplifier to the power supply or the ground. Therefore, high-frequency noise is readily generated and enters into the differential amplifier in phase through the power supply or the ground. When the noise is inputted in phase to the differential amplifier, it is of course expected that the noise is not amplified but rather is cancelled out.

However, since the differential amplifier is normally provided with a constant current source which operates in an unsaturated region, the magnitude of current flowing through the constant current source is subjected to the influence of the absolute value of the read signal DC voltage supplied to the input terminals of the differential amplifiers. Thus, the constant current characteristics are deteriorated.

Therefore, in the prior-art differential amplifier there exists a problem in that the in-phase noise is not perfectly suppressed due to fluctuations of the constant current and, therefore, a noise component is still superposed upon the output signal of the differential amplifier.

The structure and operation of the prior-art balanced differential amplifier will be described in further detail hereinafter with reference to the attached drawings in the detailed description of the preferred embodiment which follows.

SUMMARY OF THE INVENTION

With these problems in mind, therefore, it is the primary object of the present invention to provide a balanced differential amplifier which improves the constant current characteristics and thereby sufficiently suppresses in-phase noise generated from the succeeding-stage amplifier and inputted thereto through the power supply and the ground.

To achieve the above-mentioned object, the balanced differential amplifier according to the present invention comprises: (a) a first differential amplifier composed of a first differential MOS FET and a second differential MOS FET, each MOS FET having a current mirror circuit, a balanced input signal being applied in a first polarity relationship to the gates of the first and second differential MOS FETs; (b) a second differential amplifier composed of a third differential MS FET and a fourth differential MOS FET, each MOS FET having a current mirror circuit, the balanced input signal being also applied to the gates of the third and fourth differential MOS FETs in a reverse polarity relationship to the first polarity relationship applied to said first differential amplifier, a balanced output signal thus being obtainable between an output terminal of the second differential MS FET of the first differential amplifier and an output terminal of the fourth differential MOS FET of the second differential amplifier; (c) a first constant current source MOS FET connected to each source terminal of said first, second, third and fourth differential MOS FETs, a gate thereof being connected to an output terminal of said first differential MOS FET of the first differential amplifier; and (d) a second constant current source MOS FET also connected to each source terminal of said first, second, third and fourth differential MOS FETs, a gate thereof being connected to an output terminal of said third differential MOS FET of the second differential amplifier, whereby each gate voltage is applied to each of said two constant source MOS transistors in an out-of-phase relationship to each other. in the balanced differential amplifier according to the present invention, the operating points of the first and the second constant current source MOS FETs are determined near a boundary line between a saturated region and an unsaturated region and further the sum total of current flowing through said first constant current source MOS FET and current flowing through said second constant source MOS FET is substantially constant irrespective of DC voltage fluctuations of the balanced input signal applied to the balanced differential amplifier, thus improving the constant current characteristics and thereby the suppression capability against noise inputted in phase to the balanced differential amplifier.

BRIEF DESCRIPTION OF THE DRAWINGS

The features and advantages of the balanced differential amplifier according to the present invention over the prior-art amplifier will be more clearly appreciated from the following description of the preferred embodiment of the invention taken in conjunction with the accompanying drawings in which.

DETAILED DESCRIPTION OF THE PREFERRED EMBODIMENT

To facilitate an understanding of the present invention, a brief reference will be made to a prior-art balanced differential amplifier with reference to the attached drawings.

Figure 1:
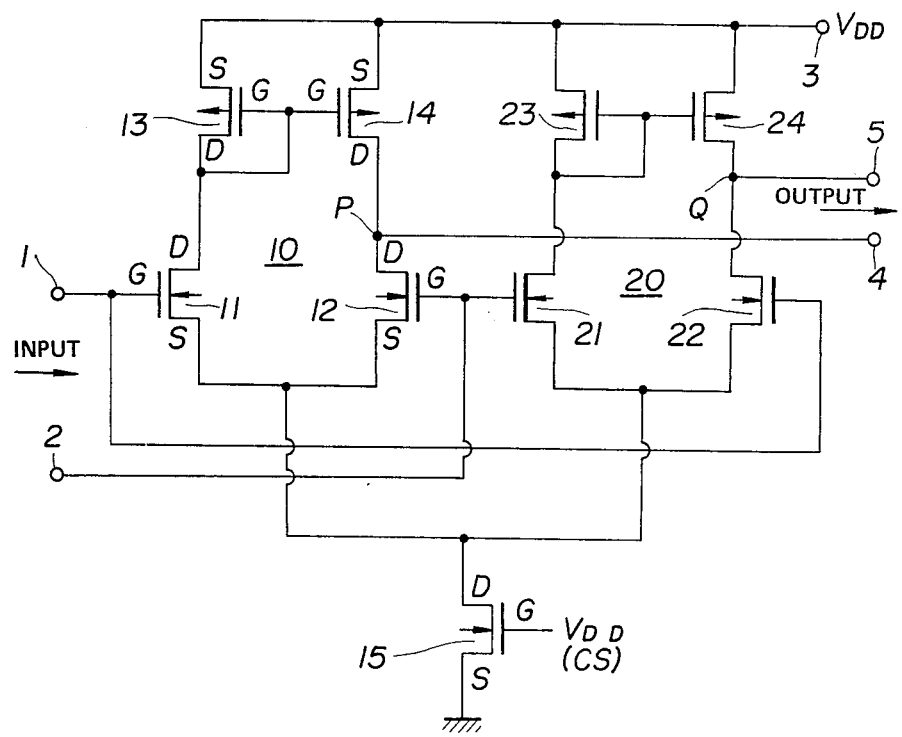
FIG. 1 is a circuit diagram showing an example of prior-art balanced differential amplifiers.

FIG. 1 shows an example of conventional circuit configurations of prior-art balanced differential amplifiers. In FIG. 1, a balanced read signal is supplied from a memory unit (not shown) to input terminals 1 and 2 thereof.

The reference numeral 10 denotes a first differential amplifier having a current mirror circuit functioning as an active load. That is, input terminals 1 and 2 are respectively connected to a gate input of each of a pair of N-channel differential MOS FETs 11 and 12 of a first differential amplifier 10, respectively to supply a balanced input signal. Each drain of the N-channel MOS FETs 11 and 12 is respectively connected to a corresponding drain of a pair of P-channel MOS FETs 13 and 14 serving as an active load. A P-channel MOS FET 13 is connected as in a diode because the gate and the drain thereof are directly connected. The gate of the other P-channel MOS FET 14 is connected to the gate of the MOS FET 13. The source of each of the P-channel MOS FETs 13 and 14 is connected to a power supply terminal 3 providing a power supply voltage $V_{DD}$. Thus, a current mirror circuit is configured. Further, the source of each of the N-channel MOS FETs 11 and 12 is connected to the drain of an N-channel MOS FET 15 serving as a constant current source. The source of the MOS FET 15 is connected to a source of reference potential, such as ground, and a power supply voltage $V_{DD}$ is supplied to the gate, during operation, as a chip select signal CS to cause the MOS FET 15 to operate in a conductive state. Further, an output terminal 4 of the differential amplifier is connected to an intermediate junction point P between the drains of the N-channel MOS FET 12 and the P-channel MOS FET 14.

The reference numeral 20 denotes a second differential amplifier. Since this second differential amplifier is configured in quite the same way as in the first differential amplifier 10, a detailed description of the configuration is omitted herein by applying the same unit digits and changing the tenth digit from 1 to 2. Further, in this differential amplifier 20, the source of each of the N-channel MOS FETs 21 and 22 is also connected to the drain of the N-channel MOS FET 15 in common with the source connections from the first differential amplifier 10. On the other hand, the gate of each of the MOS FETs 21 and 22 is respectively connected to the input terminals 2 and 1. An input signal having a reversed polarity with respect to that supplied to the first differential amplifier 10 is thus supplied to the second differential amplifier 20. Further, the other output terminal 5 is connected to an intermediate junction point Q between the connected drains of the N-channel MOS FET 22 and the P-channel MOS FET 24.

As described above, in the prior-art balanced differential amplifier of FIG. 1, since a balanced input signal is supplied to the first and second differential amplifiers 10 and 20 in an out-of-phase relationship relative to each other, a balanced output can be obtained between the two intermediate junction points P and Q of the differential amplifiers 10 and 20; that is, at both of the output terminals 4 and 5. The obtained balanced output is supplied to a succeeding stage amplifier which is not shown.

In the read amplifier for a high-speed multi-output memory unit, usually the succeeding stage amplifier has a large driving capability. Therefore, in the case where a large capacitive load is connected to the differential amplifier, a large-amplitude transient current flows through the succeeding stage amplifier to the power supply or to the ground, thus readily generating high-frequency noise. The generated noise readily enters into the first-stage balanced differential amplifier in phase through the power supply or the ground, as shown in FIG. 1.

As is well known, a differential amplifier amplifies a difference signal between two input signals and therefore it is expected that two in-phase input voltages are not amplified. In the prior-art balanced differential amplifier as shown in FIG. 1, however, if a power supply voltage $V_{DD}$ of 5V, for instance, is applied to the gate of the N-channel MOS FET 15 serving as a common constant current source for both differential amplifiers 10 and 20, since a voltage $V_{DS}$ between the drain and source of the MOS FET 15 is as low as about 2.2 V, for instance, the MOS FET 15 operates within its unsaturated region, or in its so-clled "triode range". Therefore, the magnitude of the current flowing through the MOS FET 15 is subjected to the influence of the absolute value of the read signal DC voltage supplied to the input terminals 1 and 2. Thus, the MOS FET 15 cannot provide good constant current characteristics.

In the prior-art balanced differential amplifier, therefore, in spite of being of the balanced type, there exists a problem in that the above-mentioned in-phase noise component appears on the balanced output terminals 4 and 5 without being suppressed sufficiently.

In view of the above description, reference is now made to one embodiment of the balanced differential amplifier according to the present invention.

Figure 2:
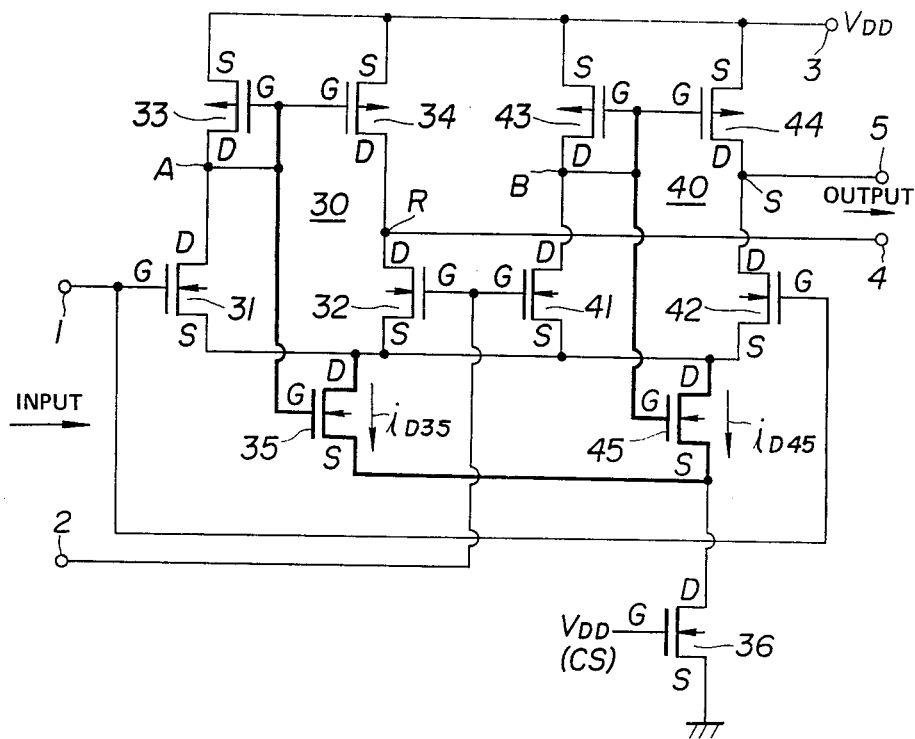
FIG. 2 is a circuit diagram showing one embodiment of the balanced differential amplifier according to the present invention.
Figure 3:
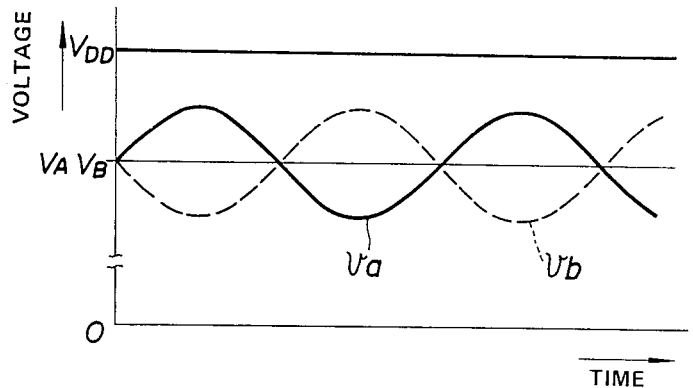
FIG. 3 is a waveform diagram for assistance in explaining the operation of the balanced differential amplifier shown in FIG. 2.

With reference to FIGS. 2 and 3, an embodiment of the balanced differential amplifier according to the present invention will be described.

In FIG. 2, the reference numeral 30 denotes a first differential amplifier having current mirror circuits serving as an active load. That is, input terminals 1 and 2 are respectively connected to the gate of each of a pair of N-channel differential input MOS FETs 31 and 32 of the differential amplifier 30, and a balanced input signal is supplied to the input terminals 1 and 2. The drain of each of the N-channel MOS FETs 31 and 32 is respectively connected to a corresponding drain of each of a pair of P-channel MOS FETs 33 and 34 serving as an active load, respectively. One P-channel MOS FET 33 is diode-connected with its gate and drain directly connected to each other, and the gate of the other P-channel MOS FET 34 is connected to the gate of the MOS FET 33. The source of each of the P-channel MOS FETs 33 and 34 is connected to a power supply terminal 3 to configure a current mirror circuit. Further, the source of each of the N-channel MOS FETs 31 and 32 is connected in common to the drain of an N-channel MOS FET 35 serving as a constant current source. The gate of the MS FET 35 is connected to an intermediate junction point A between the connected drains of the N-channel MOS FET 31 and the diode-connected P-channel MOS FET 33, and the source of the constant current MOS FET 35 is grounded through a path between the drain and the source of a large-sized chip-selecting MOS FET 36. One output terminal 4 is connected to an intermediate junction point R between the connected drains of the N-channel MOS FET 32 and the P-channel MOS FET 34.

The reference numeral 40 denotes a second differential amplifier. Since this second differential amplifier 40 is configured in quite the same way as the first differential amplifier 30, the detailed description of the configuration is omitted herein by applying the same unit digits and changing the tenth digit from 3 to 4. Further, the drain and the source of a constant current source MOS FET 45 of the second differential amplifier 40 are connected in parallel to the drain and the source of the constant current source MOS FET 35 of the first differential amplifier 30, respectively. The gate of the second constant current source MOS FET 45 is connected to an intermediate junction point B between the connected drains of the MOS FETs 41 and 43 of the second differential amplifier 40. On the other hand, the gate of each of the MOS FETs 41 and 42 is respectively connected to the input terminals 2 and 1, so that a balanced input signal is supplied to the second differential amplifier 40 with a polarity reverse to that supplied to the first differential amplifier 30. Further, the other output terminal 5 is connected to an intermediate junction point S between the connected drains of the N-channel MOS FET 42 and the P-channel MOS FET 44.

As described, even in this embodiment, since two input signals are supplied to the first and second differential amplifiers 30 and 40 in an out-of-phase relationship to each other, it is possible to obtain a balanced output at the corresponding intermediate junction points R and S of both of the differential amplifiers 30 and 40, that is, at both of the output terminals 4 and 5. This balanced output is supplied to the succeeding stage amplifier which is not shown.

Further, in the present embodiment, each gate of the constant current source MOS FETs 35 and 45 of both the differential amplifiers 30 and 40 is respectively connected to the drain of each differential input MOS FET 31 and 41 of both the differential amplifiers 30 and 40, that is, to the intermediate junction points A and B, respectively. In the case where a power supply voltage $V_{DD}$ of 5 V, for instance, is applied to the power supply terminal 3, the DC voltages $V_A$ and $V_B$ at these intermediate junction points A and B become about 4.0 V, respectively. These DC voltages $V_A$ and $V_B$ are supplied as a gate bias voltage to the MOS FETs 35 and 45, and thereby the operating points of the constant current source MOS FETs 35 and 45 are shifted to near the boundary line between the unsaturated region and the saturated region. The constant current characteristics of the MOS FETs 35 and 45 are improved markedly.

Further, in the present embodiment, since two input signals are respectively supplied to each gate of the two differential input MOS FETs 31 and 41 of both the differential amplifiers 30 and 40 in an out-of-phase relationship to each other, each drain voltage, that is, the instantaneous voltages $V_a$ and $V_b$ at the intermediate junction points A and B of both the MOS FETs 31 and 41 change in an out-of-phase relationship to each other as shown in FIG. 3. Since these out-of-phase voltages $V_a$ and $V_b$ are supplied to each gate of the constant current source MOS FETs 35 and 45, the sum total of the currents $i_{D35}$ and $i_{D45}$ respectively flowing through the MOS FETs 35 and 45 is always constant irrespective of the change in the input signal leve. Thus the overall constant current characteristics of both of the MOS FETs 35 and 45 is improved markedly for the whole balanced differential amplifier. As a result, in the present invention, the in-phase noise suppression capability is improved markedly.

As described above, according to the present invention, since each drain voltage of the corresponding differential input MOS FETs 31 and 41 of the first and second differential amplifiers 30 and 40, to which a balanced input signal is applied in out-of-phase relationship to each other, is supplied to each gate of the first and second constant current source MOS FETs 35 and 45, the overall constant current characteristics of both the constant current source MOS FETs 35 and 45 can be improved markedly. Thus, it is possible to obtain a balanced differential amplifier having a markedly improved in-phase noise suppression capability.

What is claimed is:

1. A balanced differential amplifier comprising:
   a first differential amplifier composed of a first differential MOS FET and a second differential MOS FET, each respectively connected with a current mirror circuit, a balanced input signal being applied to a gate of each of the first and second differential MOS FETs;
   a second differential amplifier composed of a third differential MOS FET and fourth differential MOS FET, each respectively connected with a current mirror circuit, the balanced input signal being also applied to a gate of each of the third and fourth differential MOS FETs in a reverse polarity relationship to that applied to said first differential amplifier, a balanced output signal being obtainable between an output terminal of the second differential MOS FET of the first differential amplifier and an output terminal of the fourth differential MOS FET of the second differential amplifier;

characterized by:
   (a) first constant current source MOS FET connected to each source terminal of said first, second, third and fourth differential MOS FETs, a gate thereof being connected to an output terminal of said first differential MOS FET of the first differential amplifier; and
   (b) a second constant current source MOS FET also connected to each source terminal of said first, second, third and fourth differential MOS FETs, a gate thereof being connected to an output terminal of said third differential MOS FET of the second differential amplifier, whereby the voltage applied to the gate of each of said first and said second constant current source MOS FETs is in an out-of-phase relationship to each other.

2. The balanced differential amplifier as set forth in claim 1, wherein operating points of said first and second constant current source MOS FETs are determined near a boundary line between a saturated region and an unsaturated region.

3. The balanced differential amplifier as set forth in claim 1, wherein a sum total of current flowing through said first constant current source MOS FET and current flowing through said second constant current source MOS FET is substantially constant irrespective of DC voltage fluctuations of the balanced input signal applied to the balanced differential amplifier.

4. The balanced differential amplifier as set forth in claim 1, wherein the voltages respectively applied to the gate of each of said first and said second constant current source MOS FETs is about equal in magnitude but opposite in phase to each other so that the sum of the currents flowing through said first and said second constant current sources is approximately constant.

5. A balanced differential amplifier comprising, in combination:
   a first differential amplifier which includes a first differential MOS FET and a second differential MOS FET, each respectively connected to a current mirror circuit, an input to each of said first and said second differential MOS FETs receiving a balanced input signal in a first polarity relationship;

a second differential amplifier which includes a third differential MOS FET and a fourth differential MOS FET, each respectively connected to a current mirror circuit, an input to each of said third and said fourth differential MOS FETs receiving said balanced input signal in a reverse polarity relationship to that applied to said first differential amplifier; and an output circuit for providing a balanced output signal between an output terminal of said second differential MS FET of said first differential amplifier and an output terminal of said fourth differential MOS FET of said second differential amplifier;

a first constant current source MOS FET connected at least to a source terminal of each of said first and said second differential MOS FETs;

a second constant current source MOS FET connected at least to a source terminal of each of said third and said fourth differential MOS FETs;

means for biasing gates of each of said first and said second constant current source MOS FETs with a voltage signal which is respectively out of phase when so applied so that the sum total of the currents respectively flowing through said first and said second constant current MOS FETs is constant irrespective of the change in said balanced input signal; and a third constant current source MOS FET connected to a source terminal of each of said first and said second constant current source MOS FETs so to provide a common source path for said sum total of currents flowing through said first and said second constant current sources.

6. The balanced differential amplifier as set forth in claim 5 wherein said biasing means causes each of said first and said second constant current source MOS FETs to be operated near the boundary line between an unsaturated region and a saturated region for said first and said second constant current source MOS FETs.

7. The balanced differential amplifier as set forth in claim 6, wherein each of said biasing means includes circuit connections between a gate electrode of each of said first and said second constant current source MOS FETs and an associated output terminal of each of said first and said third differential MOS FETs, respectively.

8. The balanced differential amplifier as set forth in claim 7, wherein said output terminal is a drain of each of said first and said third differential MOS FETs, which thus supply instantaneous voltages which vary in an out-of-phase relationship with each other to provide bias voltages to said first and said second constant current source MOS FETs, so that the sum total of the currents flowing in said constant current source MOS FETs is always substantially constant.

9. The balanced differential amplifier as set forth in claim 5, wherein a drain of each of said constant current source MOS FETs is connected in common with each of said source terminals of said first, said second, said third, and said fourth differential MOS FETs.

10. The balanced differential amplifier as set forth in claim 5, wherein a source terminal of each of said constant current source MOS FETs is commonly connected to a drain of a chip-selecting MOS FET.

11. A balanced differential amplifier comprising, in combination:

a first differential amplifier which includes a first differential MOS FET and a second differential MOS FET, each respectively connected to a current mirror circuit, an input to each of said first and said second differential MOS FETs receiving a balanced input signal in a first polarity relationship;

a second differential amplifier which includes a third differential MOS FET and a fourth differential MOS FET, each respectively connected to a current mirror circuit, an input to each of said third and said fourth differential MOS FETs receiving said balanced input signal in a reverse polarity relationship to that applied to said first differential amplifier;

an output circuit for providing a balanced output signal between an output terminal of said second differential MOS FET of said first differential amplifier and an output terminal of said fourth differential MOS FET of said second differential amplifier; and a first constant current source MOS FET connected at least to a source terminal of each of said first and said second differential MOS FETs;

a second constant current source MOS FET connected at least to a source terminal of each of said third and said fourth differential MOS FETs, a drain of each of said first and said second constant current source MOS FETs being connected in common with each of said source terminals of said first, said second, said third, and said fourth differential MOS FETs; and means for biasing gates of each of said first and said second constant current source MOS FETs with a voltage signal which is respectively out of phase when so applied so that the sum total of the currents respectively flowing through said first and said second constant current MOS FETs is constant irrespective of the change in said balanced input signal.

12. The balanced differential amplifier as set forth in claim 10, wherein said biasing means causes each of said first and said second constant current course MOS FETs to be operated near the boundary line between an unsaturated region and a saturated region for said first and said second constant current source MOS FETs.

13. The balanced differential amplifier as set forth in claim 10, wherein each of said biasing means includes circuit connections between a gate electrode of each of said first and said second constant current source MOS FETs and an associated output terminal of each of said first and said third differential MOS FETs, respectively.

14. The balanced differential amplifier as set forth in claim 12, wherein said output terminal is a drain of each of said first and said third differential MOS FETs, which thus supply instantaneous voltages which vary in an out-of-phase relationship with each other to provide bias voltages to said first and said second constant current source MOS FETs, so that the sum total of the currents flowing in said constant current source MOS FETs is always substantially constant.

* * * * *